United States Patent
Alelyunas et al.

(10) Patent No.: US 9,954,515 B2
(45) Date of Patent: Apr. 24, 2018

(54) BIQUAD STAGE HAVING A SELECTABLE BIT PRECISION

(71) Applicant: SILICON LABORATORIES INC., Austin, TX (US)

(72) Inventors: Carl H. Alelyunas, Austin, TX (US); David Anderton, Austin, TX (US); Nicholas R. Berkner, Austin, TX (US); Yue Zhao, Austin, TX (US); Thomas G. Ragan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 118 days.

(21) Appl. No.: 14/973,473

(22) Filed: Dec. 17, 2015

(65) Prior Publication Data
US 2017/0179932 A1    Jun. 22, 2017

(51) Int. Cl.
G06F 7/48 (2006.01)
H03H 21/00 (2006.01)

(52) U.S. Cl.
CPC .............. *H03H 21/0012* (2013.01)

(58) Field of Classification Search
None
See application file for complete search history.

(56) References Cited

U.S. PATENT DOCUMENTS

| | | | | |
|---|---|---|---|---|
| 6,215,429 | B1* | 4/2001 | Fischer | H03H 17/0288 341/139 |
| 2005/0076073 | A1* | 4/2005 | Gurrapu | H03H 17/0405 708/300 |
| 2006/0251197 | A1* | 11/2006 | Zaucha | H04S 3/008 375/350 |
| 2014/0059101 | A1* | 2/2014 | Steele | H03H 17/0223 708/300 |

OTHER PUBLICATIONS

Digital biquad filter, Wikipedia, the free encyclopedia; https://en.wikipedia.org/wiki/Digital_biquad_filter.

* cited by examiner

*Primary Examiner* — Michael D. Yaary
(74) *Attorney, Agent, or Firm* — Trop, Pruner & Hu, P.C.

(57) ABSTRACT

An apparatus includes a plurality of delay elements, a plurality of multipliers and an accumulator to form a biquad stage; and a precision logic circuit. The biquad stage includes feedback paths; at least one feedback path has an adjustable bit precision; and the precision logic is adapted to regulate the bit precision of the feedback path(s) based at least in part on at least one parameter that is associated with the biquad stage.

20 Claims, 8 Drawing Sheets

BIQUAD STAGE HAVING A SELECTABLE BIT PRECISION

BACKGROUND

An electronic system may include one or multiple filters that are used for various aspects of signal processing. For example, a given filter may be used to remove unwanted spectral components and/or enhance desired spectral components. As examples of filters, the electronic system may include a low pass filter that generally passes spectral components having frequencies lower than a cutoff frequency and attenuates spectral components having frequencies greater than the cutoff frequency; a high pass filter that generally passes spectral components having frequencies higher than a cutoff frequency and attenuates spectral components having frequencies lower than the cutoff frequency; a band pass filter that generally passes spectral components having frequencies within a certain continuous band of frequencies and attenuates spectral components otherwise; and so forth.

A given filter may be implemented using either analog or digital signal processing. For a filter that uses analog signal processing, the filter receives a continuous time, or analog, input signal, and the filter contains various analog circuit components (for example, resistors, capacitors and an operational amplifier) to apply the filter's transfer function to the input signal to produce a continuous time output signal. For a filter that uses digital signal processing, discrete time samples that represent time ordered samples of an input signal are numerically processed to apply the filter's transfer function to produce a discrete time output signal.

SUMMARY

In an example embodiment, an apparatus includes a plurality of delay elements, a plurality of multipliers and an accumulator to form a biquad stage; and a precision logic circuit. The biquad stage includes feedback paths; at least one feedback path has an adjustable bit precision; and the precision logic is adapted to regulate the bit precision of the feedback path(s) based at least in part on at least one parameter that is associated with the biquad stage.

In accordance with another example embodiment, an apparatus includes a non-transitory computer readable storage medium to store instructions, that when executed by a computer, cause the computer to program a plurality of coefficients for a biquad stage that includes a plurality of feedback paths; and select a bit precision of at least one feedback path based at least in part on at least one coefficient.

In accordance with another example embodiment, a technique includes providing a plurality of biquad filters to perform audio signal filtering; and regulating a feedback bit precision of a given biquad filter based at least in part on filtering coefficients of the given biquad filter.

Advantages and other features will become apparent from the following drawings, description and claims.

DETAILED DESCRIPTION

Figure 1:
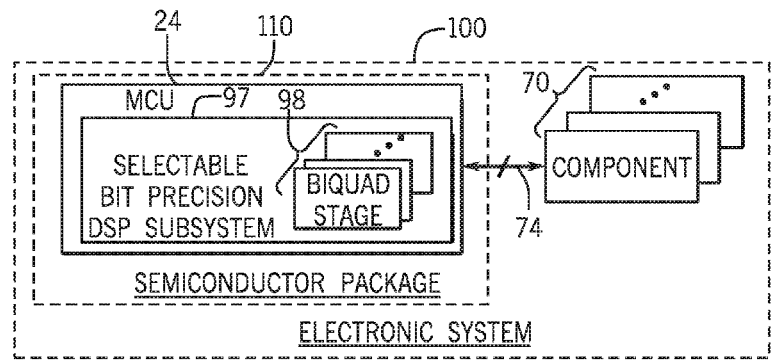
FIG. 1 is a schematic diagram of an electronic system according to an example embodiment.

An electronic system, such as a microcontroller unit (MCU)-based platform, may include a digital signal processing (DSP) subsystem to perform various functions on digital signals, such as functions pertaining to filtering, compression, decompression, mathematical computations, and so forth. For example, the electronic system may use its DSP subsystem in a demodulation process to recover content from a modulated signal, such as (as examples) a frequency modulated (FM) or amplitude modulated (AM) signal; a Wi-Fi signal (i.e., a signal based on the IEEE 802.11 standard); a cellular signal; or a Bluetooth signal (i.e., a signal based on the IEEE 802.15.1 standard). As other examples, an electronic system may use a DSP subsystem to condition audio signals for such purposes as providing audible output for a handheld device (a mobile phone, for example) or interactive user system; or processing signals for speech recognition. As yet other examples, an electronic system may use a DSP subsystem to process signals received from various sensors of the system.

One type of DSP processing involves filtering, in which a predetermined transfer function is applied to a digital input signal to selectively remove and pass spectral components based on frequency for purposes of producing a filtered digital output signal. The filter may be constructed from serially connected, or cascaded, stages. In this manner, each stage has an associated transfer function, and cascading multiple stages together mathematically multiplies their transfer functions together. Cascading stages together in this manner may be particularly advantageous for constructing a higher order filter (a filter having an order greater than or equal to four, for example).

A biquad stage (also called a "biquad") is a particular DSP-implemented stage, which is often used as a transfer function building block. The biquad stage has two poles and two zeros; and, in general, the biquad stage has a transfer function (called "H(Z)" below) that is the ratio of two polynomials, as set forth below:

$$Y(Z)/X(Z)=H(Z)=(b_0+b_1Z^{-1}+b_2Z^{-2})/(1-a_1Z^{-1}-a_2Z^{-2}), \quad \text{Eq. 1,}$$

where "Z" represents a discrete time sample; "X(Z)" represents the input signal; "Y(Z)" represents the output signal; and "$a_1$," "$a_2$," "$b_0$," "$b_1$" and "$b_2$" represent coefficients that are selected to impart the characteristics of the H(Z) transfer function, gain and so forth). In discrete time signal processing terms, $Z^{-1}=e^{-j\omega o}$, which corresponds to a delay of one sample; and $Z^{-2}=e^{-2j\omega o}$, which corresponds to a delay of two samples.

Conceptually, any ratio of polynomials may be constructed by cascading multiple biquad stages together and selecting the appropriate coefficients ($a_1$, $a_2$, $b_0$, $b_1$ and $b_2$) for each of the stages. As examples, a given transfer function may be formed from ten, twenty or even more cascaded, biquad stages.

The biquad stage may be implemented in either hardware or software. Regardless of how the biquad stage is implemented, the biquad stage represents the numerical processing of a discrete time input signal (i.e., a digital signal having a time ordered sequence of digital values) according to the biquad's transfer function to produce a discrete time output signal.

The number of bits associated with a given digital signal (i.e., the number of bits used to represent values for the digital signal) may be referred to as the bit precision of the signal. In this manner, the larger the number of bits, the higher the bit precision, and vice versa. The bit precisions of digital signals that are processed by the DSP subsystem may be constrained by the finite resources (semiconductor area, processing bandwidth, and so forth) of the subsystem. As a result, one approach for providing biquad stages is for the DSP subsystem to provide a finite number of available biquad stages and fix the bit precisions of the signals that are processed for these biquad stages.

The upper limit of the bit precision may be constrained by such factors as the DSP subsystem's resources and, in general, the number of available biquad stages that are provided by the DSP subsystem. The minimum for the bit precision may be constrained by biquad performance considerations. More specifically, the biquad stage's performance may, under certain circumstances, be adversely influenced by bit quantization effects. For example, for some biquad configurations (i.e., for a given set of biquad coefficients), the output of the biquad stage may, with a zero value input, settle to a non-zero value at its output. In general, the higher the bit precision, the less deviation from the ideal output of zero. One approach to address bit quantization effects is for the DSP subsystem to provide a limited number of biquad stages that have fixed, higher bit precisions (for transfer functions otherwise having bit quantization problems) and provide a greater number of biquad stages that have fixed, relatively lower bit precisions (for transfer functions, not subject to bit quantization problems).

In accordance with example embodiments that are described herein, a DSP subsystem provides a biquad stage that has feedbacks paths with selectable bit precisions. Using the selectable bit precision feature, the DSP subsystem may upwardly adjust the bit precisions associated with feedback paths of a given biquad stage to avoid bit quantization-related performance problems. Therefore, in accordance with example embodiments, instead of restricting the number of high bit precision biquad stages (from the larger pool of available biquad stages), all of the subsystem's biquad stages may be available for implementing transfer functions that may be sensitive to bit quantization effects.

More specifically, referring to FIG. 1, in accordance with example implementations, an electronic system 100 includes a selectable bit precision digital signal processing (DSP) subsystem 97 (called the "DSP subsystem 97" herein), which may be part of a microcontroller unit (MCU) 24. The DSP subsystem 97 provides biquad stages 98 and regulates the bit precisions of the feedbacks paths of the stages 98, as described herein, to avoid errant biquad performance.

More specifically, in accordance with example embodiments, for a given biquad stage 98, the DSP subsystem 97 determines a metric that indicates whether or not the stage's performance will be adversely impacted by inadequate bit quantization (i.e., whether the biquad stage's performance will be impacted by the default, minimum bit precision used by the DSP subsystem for the biquad stages 98). In accordance with example embodiments, based on the metric, the DSP subsystem 97 either uses a predefined, minimum bit precision for the given stage's feedback paths (i.e., the DSP subsystem 97 determines that the metric indicates that performance will not be adversely by the minimum bit precision), or the DSP subsystem 97 increases the bit precision for each of the feedback paths of the biquad stage 98 to a higher number.

In accordance with example embodiments, the MCU 24 may control various aspects of one or more components 70 of the electronic system 100. In general, the MCU 24 may communicate with the components 70 via communication input/output (I/O) signals 74, which may be wireless signals; hardwired cables-based signals; and so forth, depending on the particular embodiment. As examples, the components 70 may include such components as a lighting element; an electrical motor; a household appliance; an inventory control terminal; a computer; a tablet; a smart power meter; a wireless interface; a cellular interface; an interactive touch screen user interface; a microphones; speakers; an audio processing system; and so forth.

As depicted in FIG. 1, in accordance with example embodiments, all or part of the components of the MCU 24 may be part of a semiconductor package 110. In this manner, all or part of the components of the MCU 24 may be fabricated on a single die or on multiple dies, depending on the particular embodiment, and encapsulated to form the semiconductor package 110.

Figure 2A:
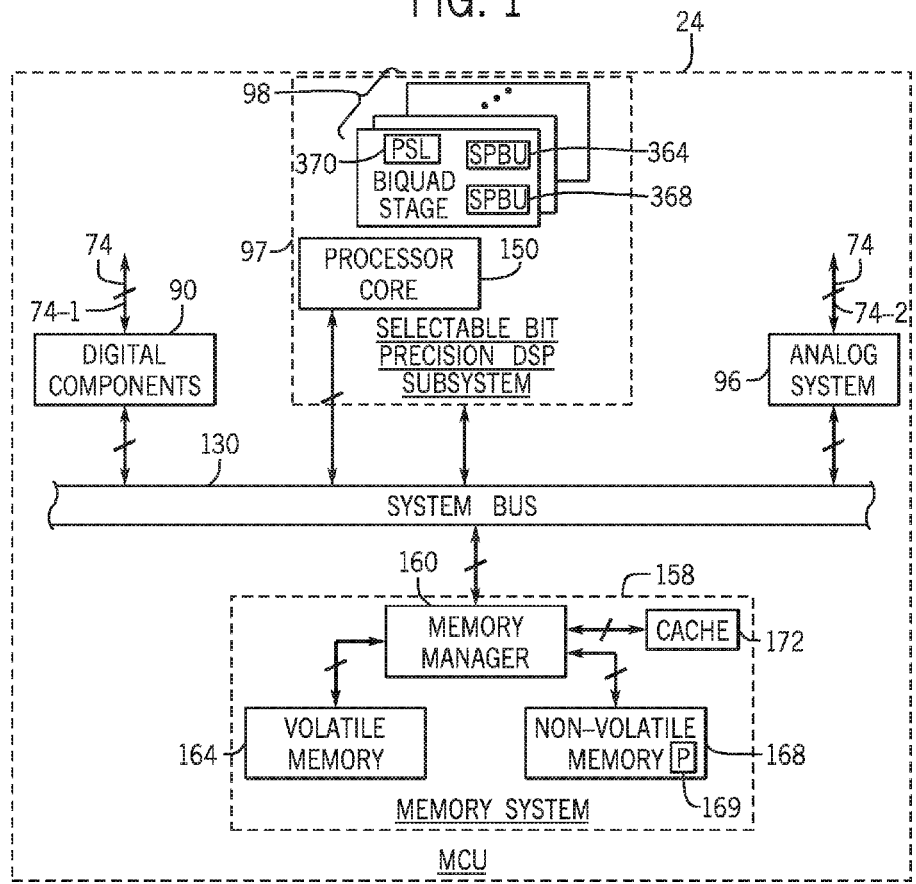
FIG. 2A is a schematic diagram of a microcontroller unit (MCU) of the electronic system of FIG. 1 according to an example embodiment.

Referring to FIG. 2A in conjunction with FIG. 1, in accordance with example embodiments, in addition to biquad stage 98, the DSP subsystem 97 may contain one or multiple processor cores 150. In accordance with further example embodiments, the processor core 150 may be a general purpose central processing unit (CPU) processing core. For example, in accordance with some embodiments, the processor core 150 may be a 32-bit core, such as an Advanced RISC Machine (ARM) processor core, which executes a Reduced Instruction Set Computer (RISC) instruction set. In accordance with some embodiments, the processor core 150 may execute a built-in DSP instruction set. For example, accordance with example embodiments, the processor core 150 may be a processor core that has a built-in DSP instruction set, such as an ARM Cortex-M4 processor core or a Tensilica HiFi processor core.

In accordance with some embodiments, the MCU 24 may contain one or multiple processor cores 150 that are dedicated for DSP processing and one or multiple processor cores 150 for other general purpose processing for the MCU 24. In accordance with further example embodiments, the MCU 24 may contain one or multiple processor cores 150 that each perform both DSP processing and general purpose processing. In accordance with some embodiments, the MCU 24 may contain a single processor core 150 that performs both DSP and general purpose processing.

As also depicted in FIG. 2A, in accordance with some embodiments, the MCU 24 may contain digital components 90 and an analog system 96. The digital components 90 may be, as examples, a Universal Serial Bus (USB) interface; a universal asynchronous receiver/transmitter (UART) interface; a system management bus interface (SMB) interface;

a serial peripheral interface (SPI) interface; timers; and so forth. In general, the digital components 90 may communicate with devices that are external to the MCU 24 via associated I/O signals 74-1.

The analog system 96 may include various analog components and systems that receive analog signals, such as analog-to-digital converters (ADCs) and comparators; as well as analog components that provide analog signals, such as current drivers. In general, the analog system 96 communicates with devices that are external to the MCU 24 via associated I/O signals 74-2.

Among its other components, the MCU 24 includes a system bus 130 that is coupled to the digital components 90, analog system 96 and processor core 150. A memory system 158 is also coupled to the system bus 130. The memory system includes a memory controller, or manager 160, which controls access to various memory components of the MCU 24, such as a cache 172, a non-volatile memory 168 (a Flash memory, for example) and a volatile memory 164 (a static random access memory (SRAM), for example). In accordance with example embodiments, the volatile memory 164 and the non-volatile memory 168 may form the system memory of the MCU 24. In other words, the volatile memory 164 and the non-volatile memory 168 have memory locations that are part of the system memory address space for the MCU 24.

It is noted that FIG. 2A depicts a general simplified representation of an example MCU architecture, as the MCU 24 have many other components, bridges, buses, and so forth, in accordance with further embodiments, which are not depicted in FIG. 2A. For example, in accordance with further example embodiments, the MCU 24 may have a bus matrix module that responds to slave side arbitration to regulate access to the memory devices of the MCU 24. Thus, many other embodiments are contemplated, which are within the scope of the appended claims.

The biquad stages 98 may be dedicated hardwired circuits or may be formed from one or multiple processor cores 150 of the MCU 24 executing machine executable instructions (firmware, for example). For example, in accordance with example embodiments, firmware program instructions 169 may be stored in the non-volatile memory 168 for purposes of configuring the MCU 24 to perform numerical processing of discrete time signals processing to construct one or multiple biquad stages 98 that have selectable bit precision. In accordance with further example embodiments, each biquad stage 98 may include dedicated hardwired circuit components, such as an accumulator, delay elements, multipliers, and so forth. Thus, many embodiments are contemplated, which are within the scope of the appended claims.

Figure 2B:
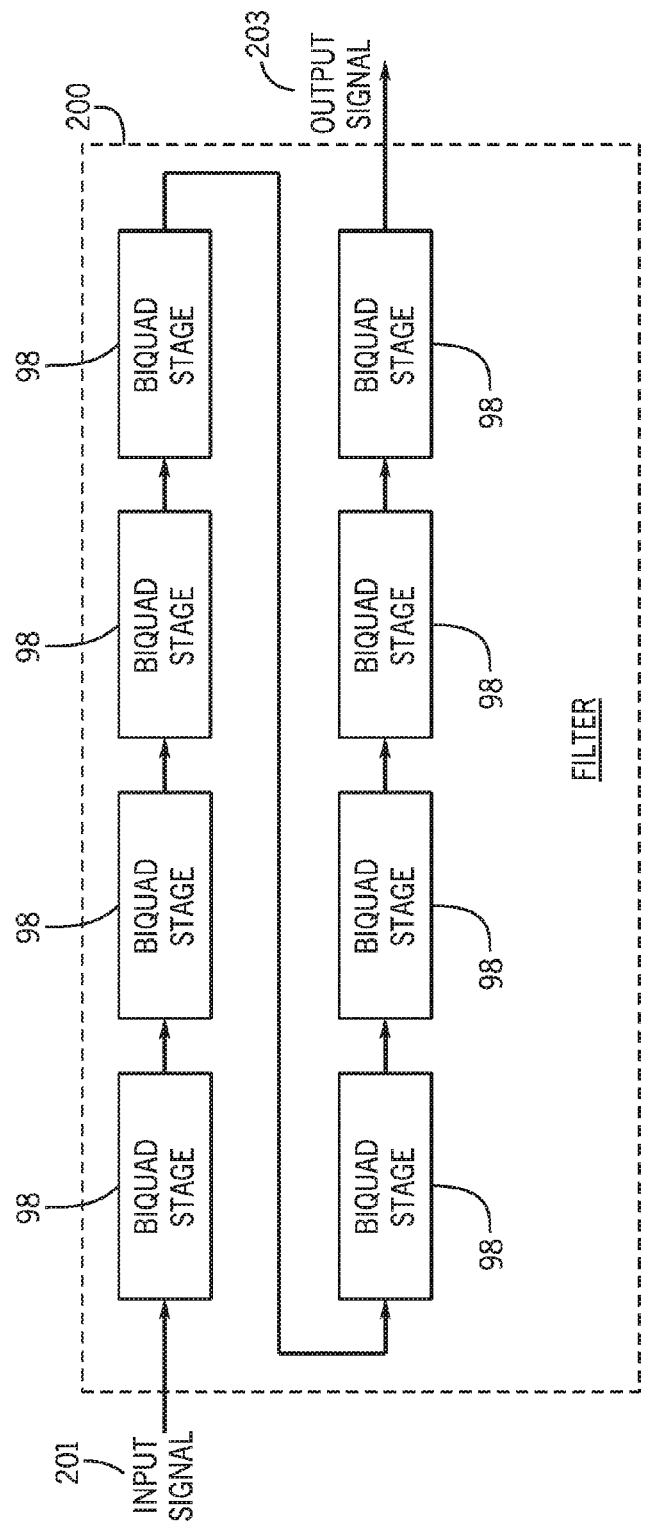
FIG. 2B is a schematic diagram of a digital filter constructed from cascaded biquad stages according to an example embodiment.

As depicted in FIG. 2A, a given biquad stage 98 may contain selectable bit precision units 364 and 368 for its feedback paths and precision selector logic 370, which selects the bit precisions for the feedback paths to avoid, or at least mitigate, bit quantization-related problems A given application program executing on the MCU 24 may use the DSP processing subsystem 97 to numerically process signals, and as part of this processing, the application may use the DSP subsystem 97 to apply one or multiple higher order transfer functions, which may each be constructed from multiple biquad stages. For example, FIG. 2B depicts a filter 99 that receives a digital input signal 201 and applies a composite transfer function formed from eight cascaded biquad stages 98 to produce an output signal 203. It is noted that a given transfer function formed from the biquad stages 98 may include more or less than eight stages 98.

Figure 3:
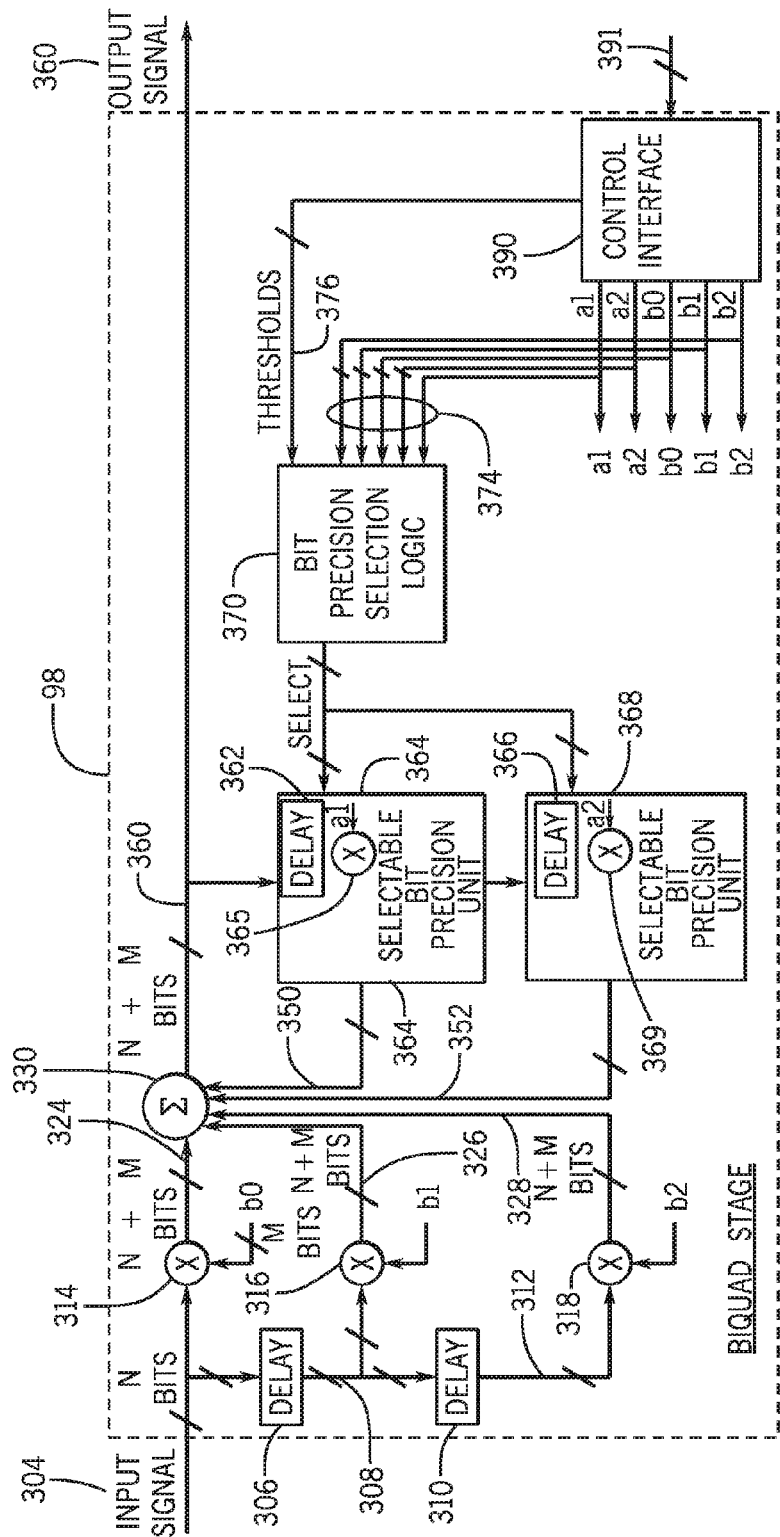
FIG. 3 is a schematic diagram of a biquad stage according to an example embodiment.

FIG. 3 depicts the biquad stage 98 in accordance with example embodiments. For these embodiments, it is assumed that the $a_1$, $a_2$, $b_0$, $b_1$ and $b_2$ biquad coefficients are M bit values. The biquad stage 98 receives an N bit input signal 304 and applies the biquad function (Eq. 1) to the input signal 304 to produce an N+M bit output signal 360. The biquad stage 98 includes an accumulator 330 that provides the output signal 360; feedforward paths from the input signal 304 to the accumulator 330, which are associated with the $b_0$, $b_1$ and $b_2$ coefficients; and feedback paths from the output signal 360 to the accumulator 330, which are associated with the $a_1$ and $a_2$ coefficients.

More specifically, one of the feedforward paths is associated with the $b_0$ coefficient and includes a multiplier 314. The multiplier 314 multiplies the N bit input signal 304 by the $b_0$ coefficient to produce an N+M bit signal that is provided to the accumulator 330. Another one of the feedforward paths is associated with the $b_1$ coefficient and includes a delay element 306 and a multiplier 316. The delay element 306 delays the input signal 304 by one sample to produce an N bit signal at the delay element's output 308, which is received by the multiplier 316. The multiplier 316 multiplies the output 308 by the $b_1$ coefficient to produce an N+M bit signal that is provided to the accumulator 330. Another one of the feedforward paths is associated with the $b_2$ coefficient and includes a delay element 310 and a multiplier 318. The delay element 310 delays the output 308 of the delay element 306 by one sample to produce an N bit signal at its output 312, which is received by the multiplier 318. The multiplier 318 multiplies the output 312 by the $b_2$ coefficient to produce an N+M output 328 that is provided to the accumulator 330.

One of the feedback paths of the biquad stage 98 is associated with the $a_1$ coefficient and includes a delay element 362 and a multiplier 365. The delay element 362 delays the output signal 360 by one sample, and the multiplier 365 multiplies the $a_1$ coefficient by the delayed output signal to produce an output 350 that is provided to the accumulator 330. Another one of the feedback paths of the biquad stage 98 is associated with the $a_2$ coefficient and includes a delay element 366 and a multiplier 369. The delay element 366 delays the output provided by the delay element 362 by one sample to provide an output that the multiplier 369 multiplies by the $a_2$ coefficient to produce an output 352 that is provided to the accumulator 330.

In accordance with example embodiments, the feedback paths of the biquad stage 98 have selectable bit precisions, which allows the biquad stage 98 to upwardly adjust the bit precision of the storage elements' outputs (i.e., the outputs of the delay elements 362 and 366) for purposes compensating for a bit quantization effects for certain transfer functions. As depicted in FIG. 3, the delay element 362 and multiplier 365 (of the feedback path associated with the $a_1$ coefficient) are part of a selectable precision unit circuit 364; and the delay element 366 and multiplier 369 (of the feedback path associated with the $a_2$ coefficient) are part of a selectable precision unit circuit 368.

In accordance with example embodiments, the biquad stage 98 includes the precision selection logic 370 that determines a metric that indicates whether or not the biquad stage's performance will be adversely impacted by inadequate bit quantization and selects the bit precision for the biquad stage's feedback paths based at least in part this metric. More specifically, in accordance with example embodiments, the precision selection logic 370 determines a metric based on one or more of the $a_1$, $a_2$, $b_0$, $b_1$ and $b_2$ coefficients; compares the determined metric to one or multiple thresholds; and based on the results of this comparison, selects (via a multibit select signal 371 provided to both selectable precision unit circuits 364 and 368, for example) a bit precision for the feedback paths. In accordance with example embodiments, the precision selection logic unit 370 selects the bit precision of the outputs of the delay element 362, 366 based on the comparison results: the precision selection logic unit 370 selects a minimum N bit precision (same as the bit precision for each of the delay element outputs 308 and 312 of the feedforward paths) or selects a greater bit precision.

More specifically, in accordance with example embodiments, the precision selection logic circuit 370 determines the following quantity:

$$\text{Evaluated Metric} = 1 - a_1 - a_2. \qquad \text{Eq. 2}$$

In accordance with example embodiments, the closer the Evaluated Metric is to zero (a value to be avoided), the more susceptible the biquad stage 98 is to bit quantization effects. In accordance with example embodiments, the precision selection logic unit 370 may determine the Evaluated Metric and compare the Evaluated Metric to multiple thresholds. For example, in accordance with some embodiments, the thresholds may be different steps above zero, and each threshold may be associated with a different bit precision. For example, the threshold that is the closest to zero may be associated with the highest bit precision (i.e., the precision selection logic 370 selects the highest bit precision if the Evaluated Metric is lower than the threshold closest to zero, for example); the next closest threshold to zero may be associated with the next highest bit precision (i.e., the precision selection logic 370 selects the next highest bit precision if the Evaluated Metric is lower than this threshold); and so forth. If the Evaluated Metric is larger than the largest of the thresholds, then the precision selection logic 370 selects the minimum bit precision (a bit precision of N bits, for example).

As depicted in FIG. 3, among the other features of the biquad stage 98, the stage 98 may include a control interface 390. The control interface 390 may be a writable I/O register (i.e., may be coupled to lines 391 to write data into the register), a system memory location, a set of parameters passed via a function call, and so forth, depending on the particular embodiment. In general, the control interface 390 may be programmed with data representing the $a_1$, $a_2$, $b_0$, $b_1$ and $b_2$ coefficients. Moreover, in accordance with example embodiments, the control interface 390 may be programmed with data representing one or multiple thresholds, against which an evaluated metric may be compared for purposes of determine a bit precision for the feedback paths of the biquad stage 98. As shown in FIG. 3, in accordance with example embodiments, the control interface 390 may communicate multibit signals to the precision selection logic 370, which represent the $a_1$, $a_2$, $b_0$, $b_1$ and $b_2$ coefficients and thresholds.

Other criteria or determined quantities may be used by the precision selection logic circuit 370 for purposes of selecting the bit precisions for the biquad's feedback paths, in accordance with further example embodiments. More specifically, referring to FIG. 4, in accordance with further example embodiments, a biquad stage 400 may replace the biquad stage 98. In general, the biquad stage 400 has a similar design to the biquad stage 98, with similar reference numerals being used to denote similar elements. However, unlike the biquad stage 98, the precision selection logic 404 (replacing the precision selection logic 370) of the biquad stage 400 selects the bit precision for its feedback paths based on one or multiple parameters that characterize the transfer function of the biquad stage 400.

Figure 4:
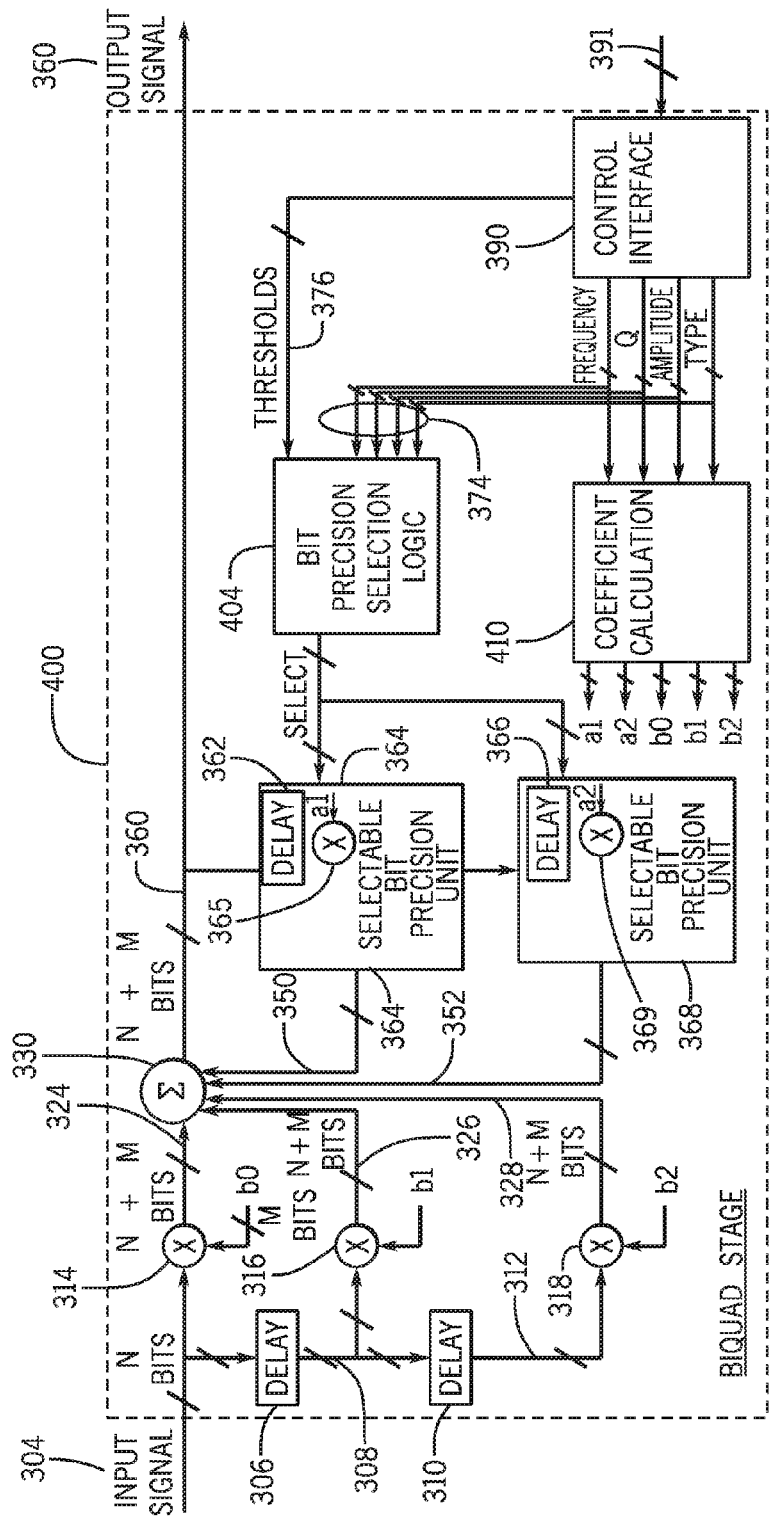
FIG. 4 is a schematic diagram of a biquad stage according to a further example embodiment.

In this manner, as depicted in FIG. 4, depending on the particular embodiment, the precision selection logic 404 may select the bit precision based on at least one of a frequency (a cutoff frequency or center frequency, for example), Q, amplitude and type (a band pass, low pass, a high pass or all pass transfer function, as examples) of the biquad sage's transfer function. For example, in accordance with further example embodiments, the precision selection logic 404 may compare a cutoff frequency (i.e., the frequency parameter) to zero (a value to be avoided), and the closer the cutoff frequency is to zero, the higher the bit precision that is selected by the precision selection logic circuit 404. As another example, the frequency may be the center frequency of a band pass filter; and the closer the center frequency is to zero (the value to be avoided), the higher the bit precision that is selected by the precision selection logic 404. As depicted in FIG. 4, in accordance with example embodiments, the control interface 390 may be programmed with data representing parameters of the biquad stage's transfer function, and a coefficient calculation circuit 410 is coupled to the interface 390 to receive the above-described parameters and calculate the $a_1$, $a_2$, $b_0$, $b_1$ and $b_2$ coefficients for the stage 400 based on the parameters.

Figure 5:
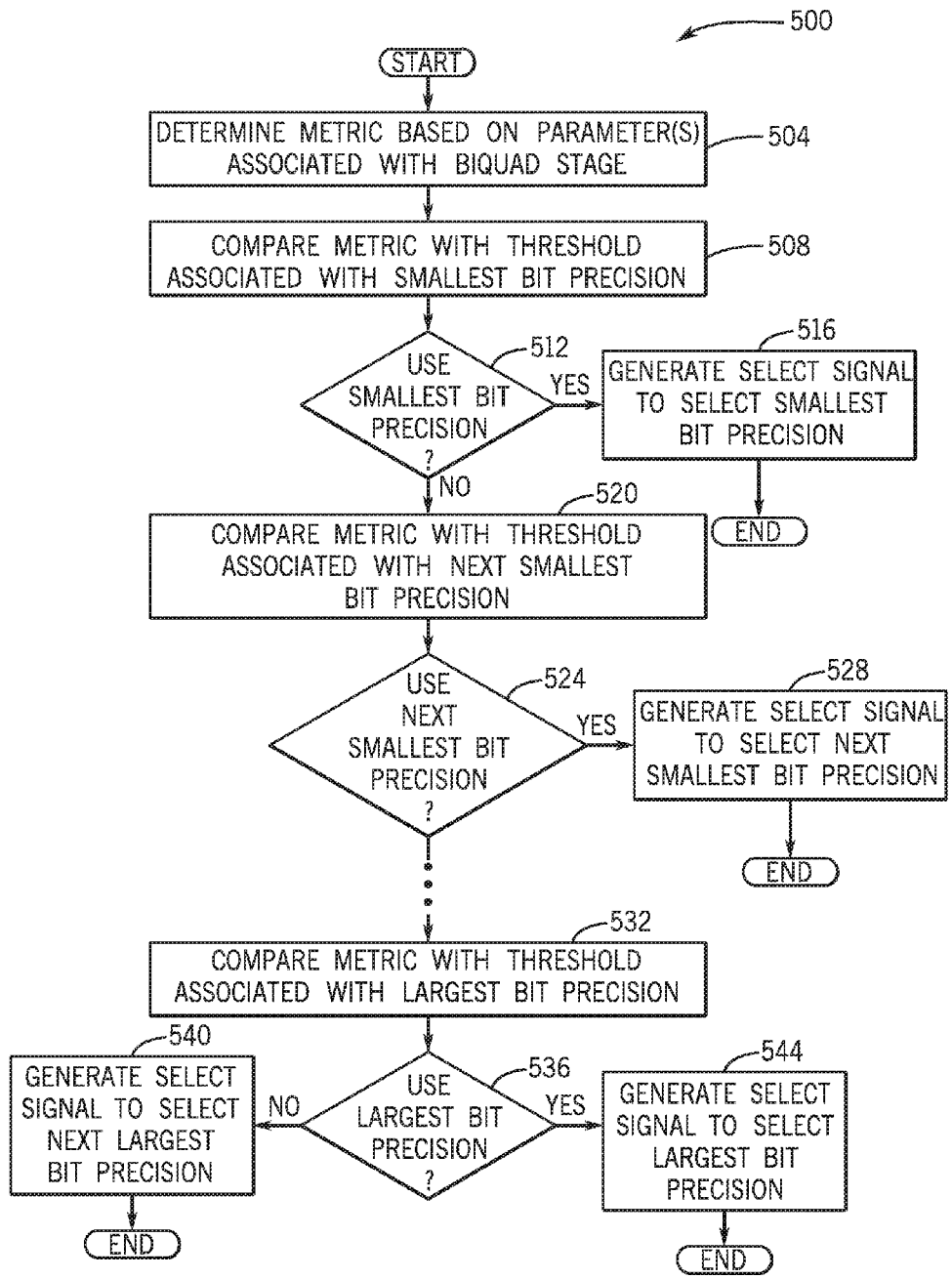
FIG. 5 is a flow diagram depicting a technique to select a bit precision of a biquad stage according to an example embodiment.

Regardless of the parameter or parameters that the precision selection logic 370 or 404 uses, the precision selection logic may, in general, perform a technique 500 that is depicted in FIG. 5. Referring to FIG. 5, pursuant to the technique 500, the precision selection logic determines (block 504) a metric, which is used by the precision selection logic to assess whether the bit precision of the biquad stage's feedback paths should be upwardly adjusted. More specifically, pursuant to the technique 500, the precision selection logic compares (block 508) the metric with a threshold that is associated with the smallest bit precision and based on this comparison, determines (decision block 512) whether the smallest bit precision may be used. If so, the precision selection logic generates a select signal to select the smallest, or minimum, bit precision, pursuant to block 516.

Otherwise, if the smallest, or minimum, bit resolution is not to be used for the biquad stages feedback paths, then, pursuant to the technique 500, the precision selection logic evaluates the determined metric against one or multiple additional thresholds. In this manner, as depicted in FIG. 5, in accordance with some embodiments, the precision selection logic may next compare (block 520) the determined metric with a threshold that is associated with the next smallest bit precision and based on this comparison, determine (decision block 524) whether the next smallest bit precision should be used, and if so, generates (block 528) the select signal to select the next smallest bit precision for the biquad stage's feedback paths.

In accordance with example embodiments, the precision selection logic may evaluate additional thresholds for purposes of determining the bit precision for the biquad's feedback stages. Ultimately, as depicted in block 532 of the technique 500, the precision selection logic compares (block 532) the metric with the largest bit precision and makes a determination (decision block 536) whether the largest bit precision should be used. If so, the precision selection logic generates (block 544) the select signal to select the largest bit precision and otherwise generates (block 540) the select signal to select the next largest bit precision.

It is noted that technique 500 is merely an example, as many variations are contemplated and are within the scope of the appended claims. For example, in accordance with some embodiments, the precision selection logic may evaluate the determined metric against a single threshold, against two thresholds, against three thresholds, and so forth. In accordance some embodiments, the precision selection logic may perform the threshold comparisons/selections in parallel. Moreover, in accordance with further example embodiments, the precision selection logic may evaluate the thresholds, beginning with the threshold associated with the largest bit precision.

Figure 6:
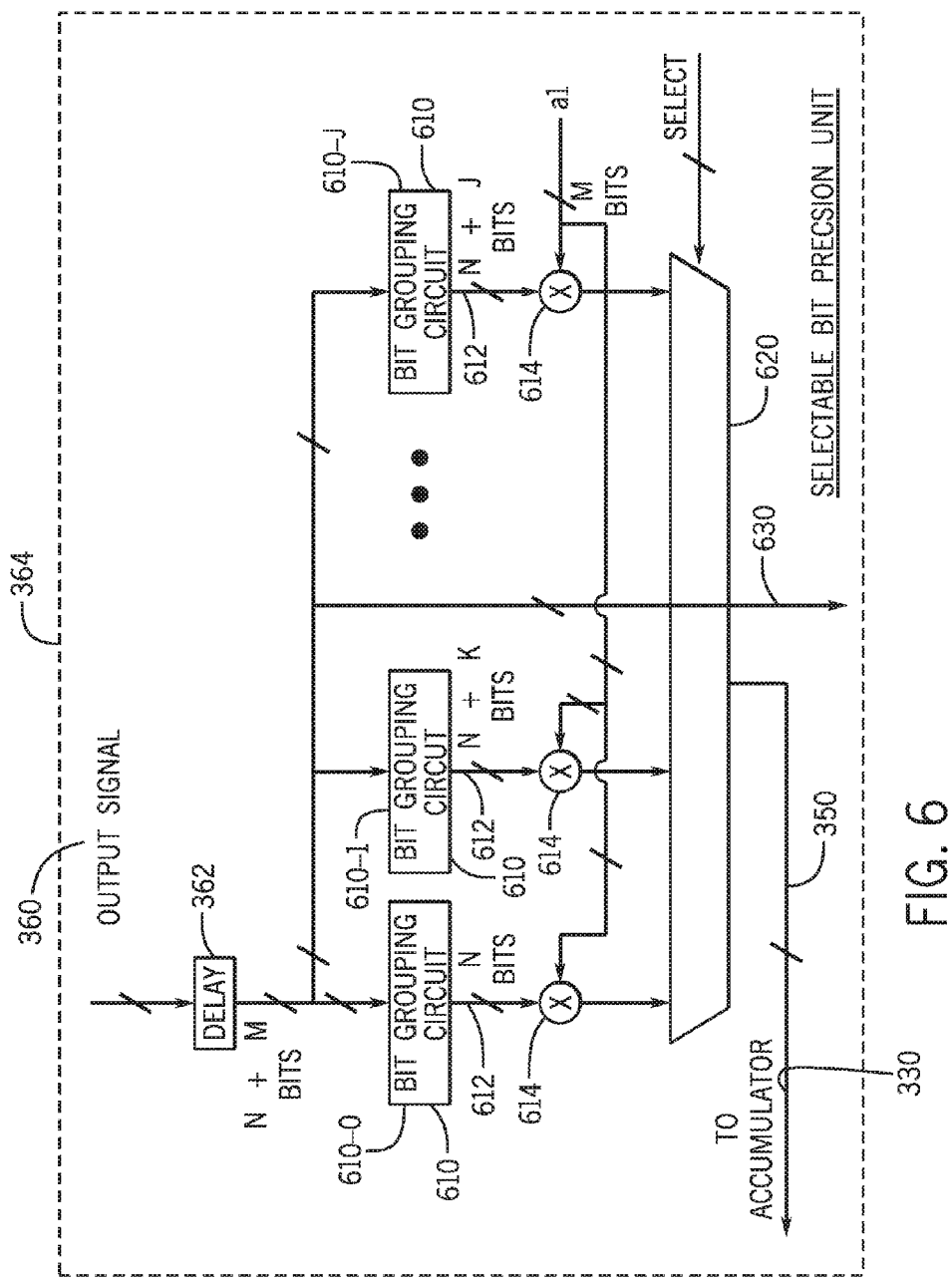
FIG. 6 is a schematic diagram of a selectable precision unit circuit of the biquad stage according to an example embodiment.

Referring to FIG. 6, in accordance with some example embodiments, the selectable precision unit 364 may include bit grouping circuits 610 (J+1 bit grouping circuits 610-0, 610-1 . . . 610-J, being depicted as examples in FIG. 6), which receive the N+M bit output from the delay element 362. As depicted in FIG. 6, each bit grouping circuit 610 has a different associated bit precision (i.e., the bit grouping circuits 610 allow selection of a minimum bit precision of N bits, as provided by the circuit 610-0 to a maximum bit precision of N+J bits, provided by the circuit 610-J). As depicted in FIG. 6, the outputs of the bit grouping circuits 610 are provided to associated multipliers 614, and each of the multipliers 614 multiplies the received output by the $a_1$ coefficient. The outputs of the multipliers 614, in turn, are provided as multibit inputs to a multiplexer 620. The select input of the multiplexer 620 receives the multibit select signal from the precision selection logic circuit 370 (for the biquad stage 98) or 404 (for the biquad stage 400). Therefore, the bit precision may be selected via the select signal so that the selected group of bits appear at the multibit output of the multiplexer 620, which provides the bits to the accumulator 330.

As also depicted in FIG. 6, for the selectable precision unit 364, the N+M bit output 530 from the delay element 362 is provided to the selectable precision unit 368. The selectable precision unit 368, in general, may have a design similar to that of the selectable precision unit 364, in accordance with example embodiments.

Figure 7:
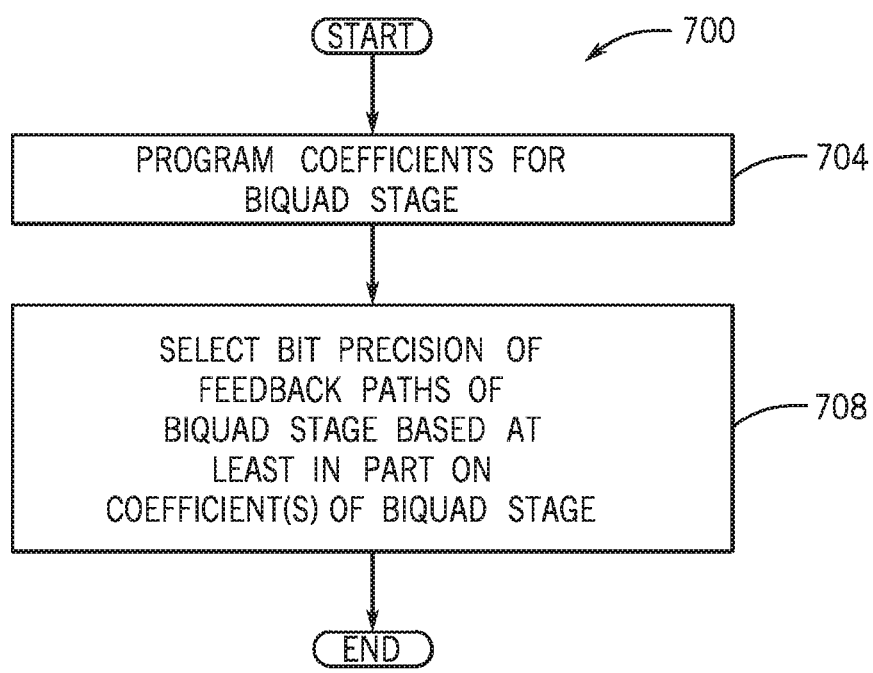
FIG. 7 is a flow diagram depicting a technique to regulate a bit precision of a biquad stage according to an example embodiment.

Referring to FIG. 7, thus, in general, a technique 700 includes programming coefficients for a biquad stage, pursuant to block 704 and selecting (block 708) a bit precision of feedback paths of the biquad stage based at least in part on one or multiple parameters that are associated with a transfer function of the biquad stage.

Figure 8:
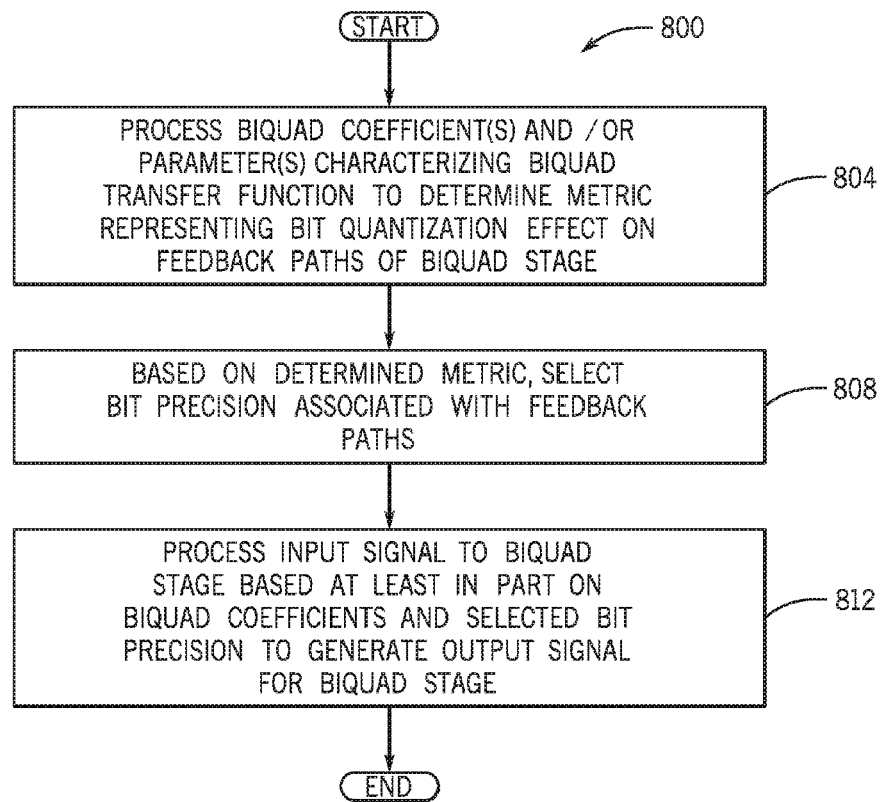
FIG. 8 is a flow diagram depicting a technique to digitally implement a biquad stage according to an example embodiment.

In accordance with example embodiments, the biquad stage 98 may be implemented solely in software, i.e., implemented by one or multiple processor cores 150 executing machine executable instructions, such as the program instructions 169 depicted in FIG. 2A. More specifically, the program instructions 169, when executed by one or multiple processor cores 150 may cause the processor cores(s) 150 to perform a technique 800 that is depicted in FIG. 8.

Pursuant to the technique 800, one or multiple filtering coefficients and/or one or multiple parameters characterizing the biquad stage's transfer function are processed (block 804) to determine a quantity that represents a bit quantization effect on feedback paths of the biquad stage. A bit precision associated with the feedback paths is then selected (block 808) based on this determined quantity. The technique 800 includes processing the input signal to the biquad stage based at least in part on the biquad coefficients and selected bit precision to generate an output signal for the biquad stage, pursuant to block 812.

While the present techniques have been described with respect to a number of embodiments, it will be appreciated that numerous modifications and variations may be applicable therefrom. It is intended that the appended claims cover all such modifications and variations as fall within the scope of the present techniques.

What is claimed is:

1. An apparatus comprising:
    a plurality of delay elements, a plurality of multipliers and an accumulator to form a biquad stage; and
    a precision logic circuit;
    wherein:
        the biquad stage comprises a plurality of feedback paths;
        at least one feedback path of the plurality of feedback paths has an adjustable bit precision; and
        the precision logic circuit is adapted to regulate the bit precision of the at least one feedback path based at least in part on at least one parameter associated with the biquad stage.

2. The apparatus of claim 1, wherein the precision logic circuit regulates the bit precision based at least in part on at least one filtering coefficient.

3. The apparatus of claim 2, wherein the precision logic circuit is adapted to:
    determine a metric $1-a_1-a_2$, where a1 is a first feedback coefficient of the biquad stage and, $a_2$ is a second filtering coefficient of the biquad stages; and
    regulate the bit precision based on a comparison of the metric to a threshold.

4. The apparatus of claim 3, further comprising:
    a coefficient calculation circuit to determine the $a_1$ and $a_2$ feedback coefficients based at least in part on at least one parameter associated a transfer function of the biquad stage.

5. The apparatus of claim 1, wherein the apparatus further comprises:
    a circuit to regulate the bit precision based at least in part on at least one parameter associated with a transfer function of the biquad stage.

6. The apparatus of claim 1, wherein:
    the at least one feedback path comprises a first delay element of the plurality of delay elements, and first multipliers of the plurality of delay elements;
    the first delay element provides multiple bits;
    each first multiplier multiples a feedback coefficient with a different set of bits of the multiple bits provided by the first delay element; and
    the at least one feedback path is adapted to select a set of the first multipliers to control the bit precision of the feedback path.

7. The apparatus of claim 1, wherein the precision selection logic is adapted to regulate a bit precision of another feedback path of the plurality of feedback paths.

8. The apparatus of claim 1, further comprising:
    an integrated circuit comprising a processor core and a non-volatile memory to store machine executable instructions; and
    wherein the precision selection logic comprises a processor to execute the instructions to regulate the bit precision.

9. The apparatus of claim 8, wherein the machine executable instructions when executed by the processor cause the processor to regulate bit precisions of a plurality of cascaded biquad stages.

10. An article comprising a non-transitory computer readable storage medium to store instructions that when executed by a computer cause the computer to:
    program a plurality of coefficients for a biquad stage comprising a plurality of feedback paths; and select a bit precision of at least one feedback path of the plurality of feedback paths based at least in part on at least one coefficient of the plurality coefficients.

11. The article of claim 10, the storage medium storing instructions that when executed by the computer cause the computer to:

select a number of bits provided by a delay element of the biquad stage based on the selected bit precision and multiple the selected number of bits by a coefficient of the programmed coefficient to provide a feedback signal for the biquad stage.

12. The article of claim 10, the storage medium storing instructions that when executed by the computer cause the computer to:

determine a metric based at least in part on at least some coefficients of the plurality of coefficients;

compare the metric to at least one threshold; and select the bit precision based at least in part on result of the comparison.

13. The article of claim 10, the storage medium storing instructions that when executed by the computer cause the computer to:

determine at least some of the coefficients based at least in part on a transfer function characteristic for the biquad stage.

14. The article of claim 10, the storage medium storing instructions that when executed by the computer cause the computer to:

select a bit precision of each of the plurality of feedback paths based at least in part on at least one coefficient of the plurality of coefficients.

15. A method comprising:

providing a plurality of biquad filters to perform audio signal filtering; and regulating a feedback bit precision of a given biquad filter of the plurality of biquad filters based at least in part on filtering coefficients of the given biquad filter.

16. The method of claim 15, wherein regulating the feedback bit precision comprises:

defaulting to a minimum precision for the given biquad filter; and selectively increasing the precision based at least in part on a metric representing a sensitivity of a performance of the biquad filter to bit quantization.

17. The method of claim 15, wherein providing the plurality of biquad filters comprises providing the plurality of biquad filters for a digital signal processing subsystem.

18. The method of claim 15, further comprising determining the filtering coefficients based at least in part on at least one parameter of a transfer function for the biquad filter.

19. The method of claim 15, wherein regulating the feedback bit precision comprises regulating a number of bits representing a delayed output signal for the given biquad filter and multiplying the regulated number of bits by a coefficient of the filtering coefficients.

20. The method of claim 15, further comprising:

determining a quantity $1-a_1-a_2$, wherein $a_1$ is a first feedback coefficient of the biquad filter and $a_2$ is a second feedback coefficient of the biquad filter; and selecting the adjustable bit precision based at least in part on a comparison of the quantity to a threshold.

* * * * *